(12) United States Patent
Weiser et al.

(10) Patent No.: US 7,521,286 B2
(45) Date of Patent: Apr. 21, 2009

(54) METHODS OF REFINING LEAD-CONTAINING MATERIALS

(75) Inventors: Martin W. Weiser, Liberty Lake, WA (US); Nancy F. Dean, Liberty Lake, WA (US); Brett M. Clark, Spokane, WA (US); Michael J. Bossio, Spokane, WA (US); Ronald H. Fleming, Spokane, WA (US); James P. Flint, Spokane, WA (US)

(73) Assignee: Honeywell International Inc., Morristown, NJ (US)

( * ) Notice: Subject to any disclaimer, the term of this patent is extended or adjusted under 35 U.S.C. 154(b) by 143 days.

(21) Appl. No.: 11/418,668

(22) Filed: May 5, 2006

(65) Prior Publication Data

US 2006/0201279 A1    Sep. 14, 2006

Related U.S. Application Data

(62) Division of application No. 10/670,319, filed on Sep. 26, 2003.

(60) Provisional application No. 60/417,241, filed on Oct. 8, 2002.

(51) Int. Cl.
*H01L 21/44* (2006.01)
*H01L 21/48* (2006.01)
*H01L 21/50* (2006.01)

(52) U.S. Cl. ............................. 438/108; 438/613
(58) Field of Classification Search ................ 438/108, 438/612, 613, 614, 617, 666
See application file for complete search history.

(56) References Cited

U.S. PATENT DOCUMENTS

| | | | |
|---|---|---|---|
| 5,545,306 A | 8/1996 | Shimamune et al. | |
| 5,618,404 A | 4/1997 | Okuhama et al. | |
| 5,965,945 A * | 10/1999 | Miller et al. | ................ 257/781 |
| 6,221,691 B1 | 4/2001 | Schrock | |
| 6,224,690 B1 | 5/2001 | Andricacos et al. | |
| 6,433,390 B1 | 8/2002 | Hara | |
| 6,777,814 B2 | 8/2004 | Iwasaki et al. | |

FOREIGN PATENT DOCUMENTS

WO    PCT/US03/30783    9/2003

* cited by examiner

*Primary Examiner*—A. Sefer
*Assistant Examiner*—Dilinh P Nguyen

(57) ABSTRACT

The invention includes solder materials having low concentrations of alpha particle emitters, and includes methods of purification of materials to reduce a concentration of alpha particle emitters within the materials. The invention includes methods of reducing alpha particle flux in various lead-containing and lead-free materials through purification of the materials. The invention also includes methods of estimating the fractionation of a low concentration of one or more alpha particle emitters during purification of a material.

7 Claims, 3 Drawing Sheets

ND OF REFINING
LEAD-CONTAINING MATERIALS

RELATED PATENT DATA

This patent resulted from a divisional of U.S. patent application Ser. No. 10/670,319, filed Sep. 26, 2003, which is hereby incorporated by reference; and which is related to U.S. Provisional Application Ser. No. 60/417,241, which was filed on Oct. 8, 2002, and which is hereby incorporated by reference.

TECHNICAL FIELD

The invention pertains to semiconductor packages; lead-containing solders and anodes; and methods of removing alpha-emitters from materials.

BACKGROUND OF THE INVENTION

Solders are commonly utilized in semiconductor device packaging. If the solders contain alpha particle emitting isotopes (referred to herein as alpha particle emitters), emitted alpha particles can cause damage to packaged semiconductor devices. Accordingly, it is desired to reduce the concentration of alpha particle emitters within the solders.

An exemplary prior art semiconductor package is shown in FIG. 1 as a package 50, with the exemplary package representing a flip-chip construction. The package comprises a semiconductor component 12 (such as, for example, an integrated circuit chip). The package also comprises a board 14 utilized to support the semiconductor component 12. A plurality of contact pads 38 (only some of which are labeled) are joined to chip 12, and a plurality of contact pads 40 (only some of which are labeled) are joined to board 14. Solder balls or bumps 39 (only some of which are labeled) are provided between pads 38 and 40 to form electrical interconnects between pads 38 and 40. The electrical connection utilizing the solder balls or bumps 39 with pads 38 and 40 can incorporate so-called wafer bump technology.

Suitable encapsulant 44 can be provided over the chip 12 and substrate 14 as shown. Additionally, and/or alternatively, thermal transfer devices (not shown) such as heat sinks and heat spreaders can be provided over the chip 12.

Contact pads 30 (only some of which are labeled) are on an underside of the board 14 (i.e., on a side of board 14 in opposing relation relative to the side proximate chip 12). Contact pads 30 typically comprise stacks of copper, nickel and gold. Solder balls 32 (only some of which are labeled) are provided on the contact pads and utilized to form electrical interconnections between the contact pads 30 and other circuitry (not shown) external of the chip package. The contact pads 40 can be connected with pads 30 through circuit traces (not shown) extending through board 14.

The shown package 50 has solder proximate chip 12 from at least balls 39, and possibly through wafer bumps associated with pads 38 and/or pads 40. There can be other applications of solder within package 50 which are not specifically shown. For instance, a solder paste can be provided between chip 12 and various thermal transfer devices.

The solders utilized in package 50 can be problematic, as discussed above, in that the solders can contain alpha particle emitters. Alpha particles are problematic for semiconductor devices because the alpha particles can induce so-called soft errors. The errors are referred to being "soft" in that the errors are not permanent. However, the errors will typically cause at least one round of incorrect calculations.

There are numerous sources for alpha particles, including reactions caused by cosmic rays. However, the source which is frequently most problematic for semiconductor device packages is solder utilized for forming various interconnections relative to semiconductor dies. For instance, the wafer-bump technique is becoming relatively common for forming high density interconnects to semiconductor dies. The bumps are portions of solder formed over electrical nodes associated with a semiconductor die package. If the solder utilized in the bumps has alpha particle emitting components, the alpha particles are frequently emitted close to integrated circuitry associated with the semiconductor die.

Occasionally, the solder formed over the electrical nodes is in the form of large pillars. Such pillars are frequently referred to as columns. For purposes of interpreting this disclosure, the term "bump" is to be understood to encompass various forms of solder formed over electrical nodes, including the forms commonly referred to as columns.

A typical component of many solders is lead. However, one of the lead isotopes (specifically $^{210}$Pb) has a decay chain that leads to alpha particles. Further, various common contaminants of lead can emit alpha particles, including, for example, isotopes of uranium, thorium, radium and polonium.

The alpha particle emitters present in lead can be present in the ore from which the lead is initially refined. Alpha particle emitters can be alternatively, or additionally, introduced during processing and/or use of the lead. For instance, phosphoric acid and some antistatic systems contain alpha particle emitters; some abrasives and cleaning agents can introduce alpha particle emitters into lead; and smelting of commercial lead can introduce uranium, thorium and other alpha particle emitters into the lead from gangue rock.

The amount of alpha particle emitters present in lead is typically determined by an alpha flux measurement, with results stated in terms of alpha particle counts per unit area per hour (cts/cm$^2$/hr). It is possible to commercially obtain lead having an alpha flux of from 0.002 to 0.02 cts/cm$^2$/hr, but it is very difficult to obtain a material with a lower alpha flux. However, the semiconductor industry is requesting materials with significantly lower alpha flux, including for example, materials having an alpha flux of less than 0.0001 cts/cm$^2$/hr.

Among the difficulties associated with reducing the concentration of alpha flux emitters in a material to extremely low levels is a difficulty in measuring the concentration of the emitters at flux levels below 0.002 cts/cm$^2$/hr. Unless the concentration can be measured, it is difficult to monitor a purification process to determine if alpha particle emitters are being removed. For instance, it can be difficult to determine at any given stage of the purification process if alpha particle emitters are fractionating with a material or away from the material.

Although the discussion above focuses on removing alpha particle emitters from lead-containing solders, it should be understood that alpha particle emitters are also problematic in other materials. For instance, one of the methods utilized to reduce the concentration of alpha particle emitters in solder has been to create so-called lead-free solders. Such solders contain little, if any, lead, which is desirable from an environmental perspective. However, the solders can still have an undesirable amount of alpha particle emitters present therein. Exemplary lead free solders are Sn: 3.5% Ag; Sn:4% Ag:0.5% Cu; and Bi:2-13% Ag, where the percentages are by weight.

One of the methods which has been utilized for reducing the number of alpha particle emitters in lead-containing solders is to start with lead materials which have very few emitters therein. Presently there are three sources of such materials. The sources are (1) very old lead where the $^{210}$Pb has substantially all decayed; (2) some specific PbS ore bodies which have very little $^{210}$Pb therein, and which have been carefully refined; and (3) lead which has been subjected to laser isotope separation to remove the $^{210}$Pb from the lead. Various problems exist with all of the sources. For instance, the first source utilizes very old Pb, and such is often poorly refined and therefore contains various radionuclides as contaminants. The second source typically does not have a low enough alpha particle emitter concentration to meet the ultimately desired requirements of the semiconductor industry. The third source is very energy intensive to form, and therefore is not commercially feasible.

SUMMARY OF THE INVENTION

In one aspect, the invention includes a method of refining a material. An initial composition of the material is provided. The initial composition has an alpha flux of greater than or equal to 0.002 cts/cm$^2$/hr. The material is purified to form a second composition of the material. The second composition has an alpha flux of less than 0.001 cts/cm$^2$/hr, preferably less than 0.0005 cts/cm$^2$/hr, more preferably less than 0.0002 cts/cm$^2$/hr, and even more preferably less than 0.0001 cts/cm$^2$/hr. The purification can comprise, for example, electro-refining and/or chemical refining.

In yet another aspect, the invention includes a semiconductor structure comprising a solder having an alpha flux of less than 0.001 cts/cm$^2$/hr, preferably less than 0.0005 cts/cm$^2$/hr, more preferably less than 0.0002 cts/cm$^2$/hr, and even more preferably less than 0.0001 cts/cm$^2$/hr.

In yet another aspect, the invention includes a lead-containing anode having an alpha flux of less than 0.001 cts/cm$^2$/hr, preferably less than 0.0005 cts/cm$^2$/hr, more preferably less than 0.0002 cts/cm$^2$/hr, and even more preferably less than 0.0001 cts/cm$^2$/hr.

In yet another aspect, the invention includes a lead-containing solder bump having an alpha flux of less than 0.001 cts/cm$^2$/hr, preferably less than 0.0005 cts/cm$^2$/hr, more preferably less than 0.0002 cts/cm$^2$/hr, and even more preferably less than 0.0001 cts/cm$^2$/hr. The bump can, in particular aspects, be in the form of a column.

In yet another aspect, the invention includes a lead-containing solder paste having an alpha flux of less than 0.001 cts/cm$^2$/hr, preferably less than 0.0005 cts/cm$^2$/hr, more preferably less than 0.0002 cts/cm$^2$/hr, and even more preferably less than 0.0001 cts/cm$^2$/hr.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

Figure 1:
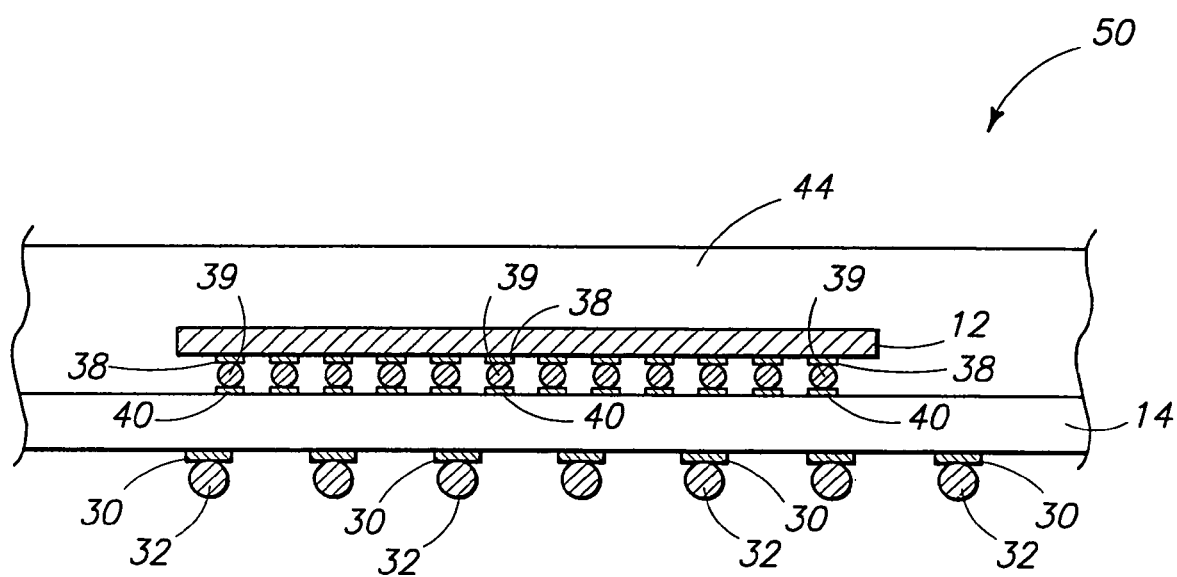
FIG. 1 is a diagrammatic cross-sectional side view of a prior art semiconductor package construction.

This disclosure of the invention is submitted in furtherance of the constitutional purposes of the U.S. Patent Laws "to promote the progress of science and useful arts" (Article 1, Section 8).

One aspect of the invention is a recognition that even though a lead isotope ($^{210}$Pb) is the prominent alpha emitter of lead containing high concentrations of alpha emitters, such is not the case with lead containing low or very low concentrations of alpha emitters; For purposes of interpreting this disclosure and the claims that follow, lead containing low concentrations of alpha emitters is lead having an alpha flux of about 0.02 cts/cm$^2$/hr, and lead containing very low concentrations of alpha emitters is lead having an alpha flux of about 0.002 cts/cm$^2$/hr.

It appears that uranium isotopes, thorium isotopes, and perhaps other non-lead isotopes are the primary alpha emitters of lead containing low or very low concentrations of alpha emitters. This conclusion is based on the observation that alpha flux versus time for lead containing low and very low concentrations of alpha particle emitters does not follow the secular equilibrium curve predicted from $^{210}$Pb decay. The recognition that the primary alpha emitters of lead are non-lead isotopes leads to improved methods for reducing the alpha emitter level of lead initially containing low and very low concentrations of alpha particle emitters. Specifically, the alpha emitter level can be reduced with purification methods that remove the minor amounts of non-lead contaminants from the lead. An exemplary method developed in accordance with aspects of the present invention is electro-refining utilizing a bath containing nitric acid:water (with the nitric acid concentration being from about 2% to about 50%, by volume)

The recognition that non-lead impurities are a primary alpha emitters for lead containing low or very low concentrations of alpha emitters is also supported by an observation that alpha flux of such lead can scale with impurity content of the lead.

Although the invention is generally described herein with reference to removing alpha particle emitting materials from lead, it is to be understood that the invention can also be utilized for purifying materials other than lead (for example metals, such as tin, silver, copper, indium, bismuth etc. that are frequently incorporated into lead-free solders). The removal of alpha particles can be particularly beneficial for metals utilized in semiconductor manufacture; such as, for example, metals incorporated into wafer bump solders.

One aspect of the invention is a method of indirectly tracking a low concentration of at least one alpha particle emitter during purification of an elemental material. The alpha particle emitter is a contaminant, rather than an isotope of the material. In particular aspects the material can be lead and the alpha particle emitters are isotopes of thorium and uranium. One or more contaminants are identified which are present in the elemental material at a greater concentration than the alpha particle emitters, and which fractionate similarly to the emitters during purification. The identified contaminants are preferably substances which can be easily tracked during the purification. The fractionation of the contaminants refers to distribution of the contaminants between a portion remaining with the elemental material which is to be purified during the purification process, and a portion separating from the elemental material. Preferably, the fractionation will be such that substantially entirely all of the contaminants separate from the elemental material during the purification process.

The fractionation of the contaminants is tracked during the purification, and from such tracked fractionation is extrapolated the fractionation of one or more alpha particle emitters. Accordingly, the fractionation of the alpha particle emitter is inferred (i.e., indirectly determined), rather than being directly measured. Such can avoid problems associated with attempting to measure an alpha flux for a material having a very low concentration of alpha particle emitters. A low or very low concentration of alpha particle emitters generates an alpha flux which is typically not significantly different from background, and which is accordingly typically very difficult to measure with a high degree of confidence. Since the alpha particle emitters are contaminants rather than isotopes of the elemental material being purified, the alpha particle emitters will fractionate with other contaminants if the purification utilizes methodology which very specifically fractionates the elemental material from contaminating substances. Exemplary methodology having appropriate specificity is electro-refining. Chemical refining can also be used, either in addition to or alternatively to the electro-refining.

The elemental material which is to be purified can, as discussed above, be lead, and can initially comprise at least 99.99 weight % lead prior to the purification. Accordingly, the elemental material which is to be purified can be considered to consist essentially of, or consist of, lead. In other aspects, the elemental material which is to be purified can consist essentially of, or consist of Ag, Sn, Cu, Bi and In. In specific aspects, the material which is to be purified can be ultimately used in a lead-free solder.

The method of purification can be any suitable method, including, for example, chemical refining and/or electro-refining. In an exemplary method of purifying lead, electro-refining is utilized with a bath comprising water and one or more of nitric acid, methane sulfonic acid, fluosilicate and fluoborate. In particular aspects of the invention it is found that electro-refining of lead in a bath comprising or consisting essentially of nitric acid and water (with the nitric acid being present to a concentration of from about 2% to about 50%, by volume) can be particularly effective for reducing the alpha flux of lead that initially contains low or very low concentrations of alpha emitters. Exemplary conditions for the electro-refining of the lead in a nitric acid bath include a bath temperature of from about 70° F. (21° C.) to about 100° F. (38° C.), a treatment time of from about several hours to about several days, and a treatment current density of from about 1 A/ft² to about 70 A/ft².

Figure 2:
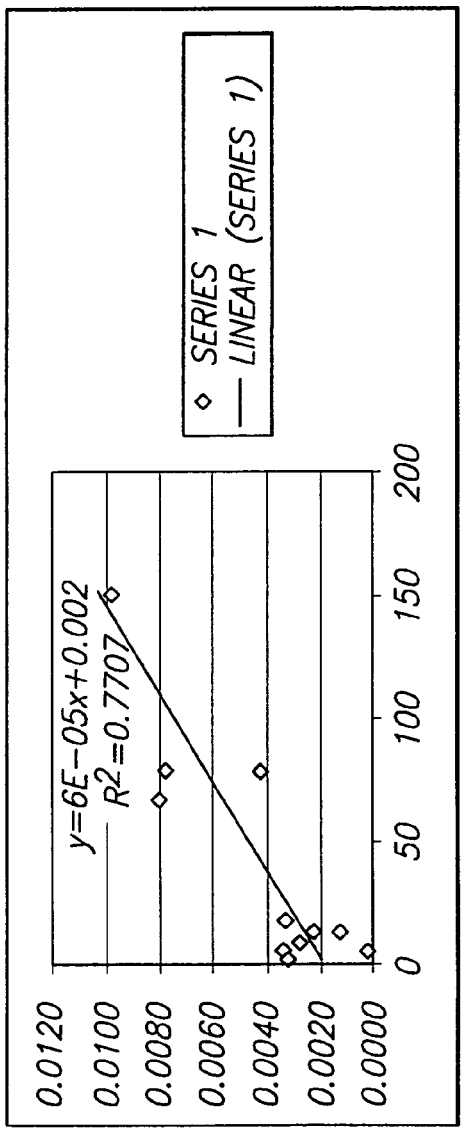
FIG. 2 is a graph of alpha counts/cm$^2$/hour versus total impurities for a material purified in accordance with an aspect of the present invention.
Figure 3:
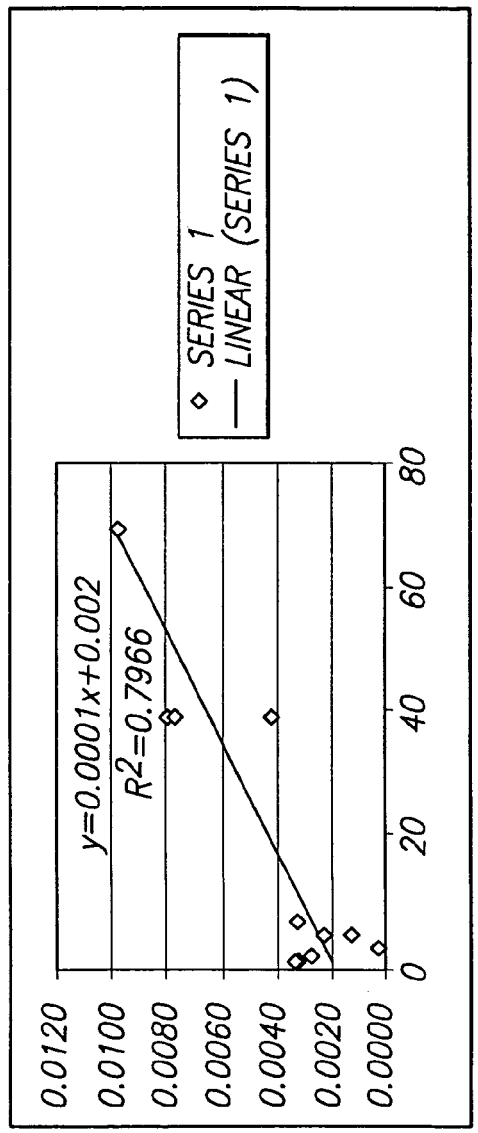
FIG. 3 is a graph of alpha counts/cm$^2$/hour versus copper concentration for a material purified in accordance with an aspect of the present invention.
Figure 4:
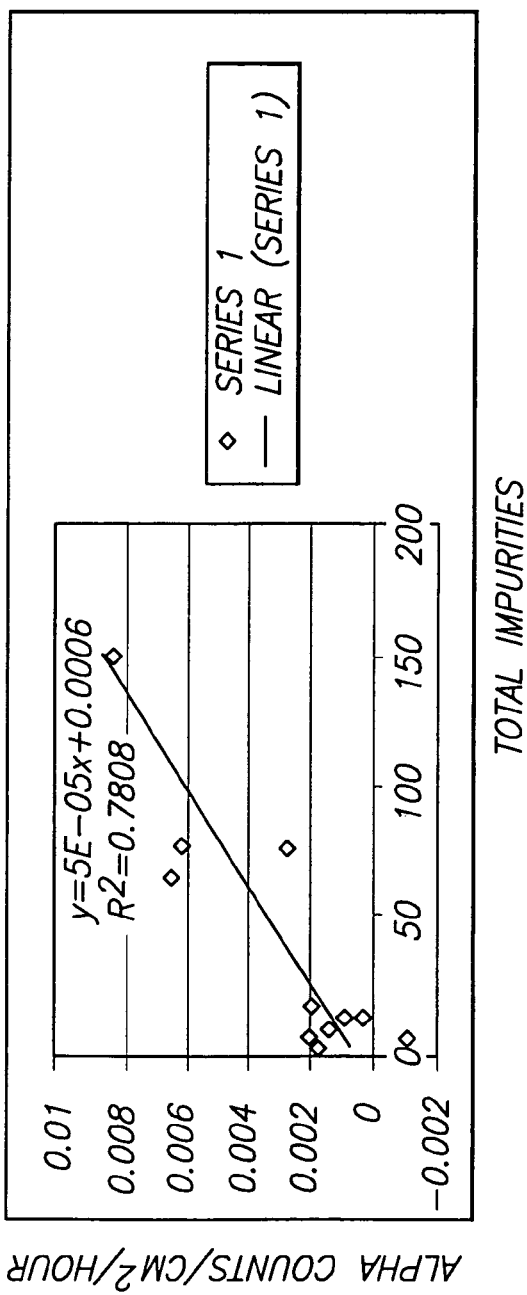
FIG. 4 is a graph of alpha counts/cm$^2$/hour versus total impurities for a material purified in accordance with an aspect of the present invention.
Figure 5:
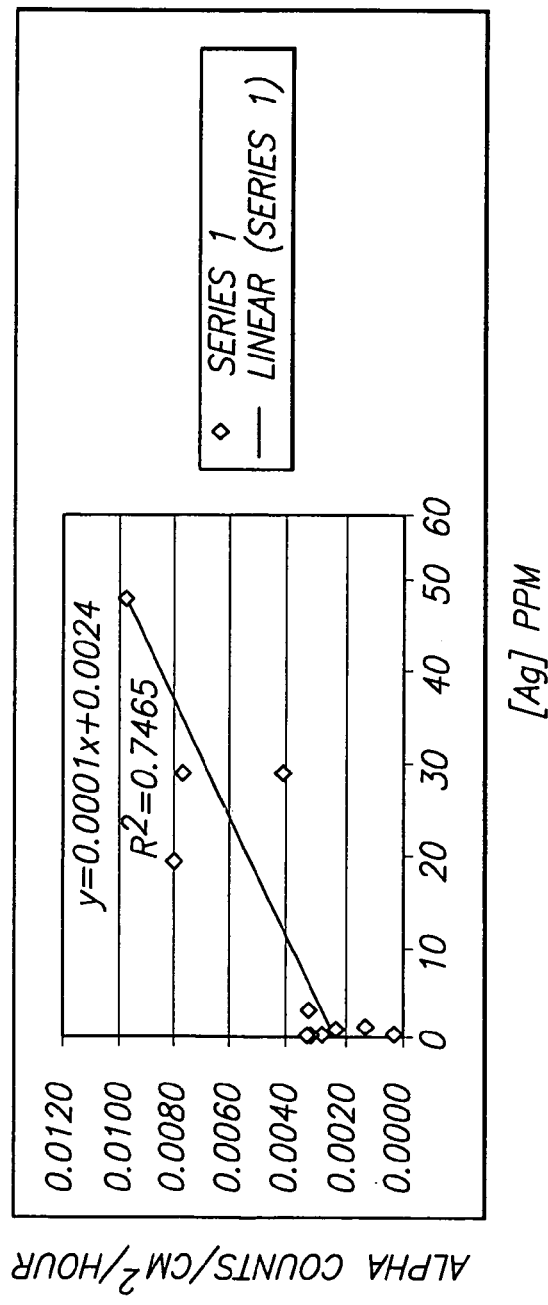
FIG. 5 is a graph of alpha counts/cm$^2$/hour versus silver concentration for a material purified in accordance with an aspect of the present invention.

Several graphs are provided with this disclosure (labeled as FIGS. 2-5), and such graphs evidence that the alpha flux of a material can scale with the total amount of impurities in the material. Accordingly, the fractionation of alpha emitting particles during a purification process can be extrapolated from the fractionation of other impurities during the purification process. Purification of 99.99% pure silver to 99.999% pure silver resulted in a decrease of alpha activity from 0.0162±0.0017 cts/cm²/hr to 0.0062±0.0007 cts/cm²/hr. Purification of 99.99% pure tin to 99.999% pure tin resulted in a decrease of alpha activity from 0.0066±0.0005 to 0.0007±0.0008.

TABLE 1

Trace Element Components of Silver

| Element | Concentration (ppm) in 99.99% Ag | Concentration (ppm) in 99.999% Ag |
|---|---|---|
| Au | 7 | <0.5 |
| Cu | 5 | <0.1 |

TABLE 1-continued

Trace Element Components of Silver

| Element | Concentration (ppm) in 99.99% Ag | Concentration (ppm) in 99.999% Ag |
|---|---|---|
| Bi | 10 | <0.1 |
| Fe | 0.7 | <0.1 |

TABLE 2

Trace Element Components of Tin

| Element | Concentration (ppm) in 99.99% Sn | Concentration (ppm) in 99.999% Ag |
|---|---|---|
| Ag | 1 | 0.1 |
| Cu | 1 | 0.1 |
| Mg | 0.3 | 0.1 |
| Si | 0.3 | 0.1 |
| Pb | 10 | <0.2 |

As stated above, the methodologies of the present invention can be utilized for purifying materials associated with lead-free solders, as well as for purifying materials associated with lead-containing solders. The utilization of the methodologies for reducing alpha emitter concentrations in lead-free solders can have numerous advantages. For instance, it is frequently assumed that lead-free solders will have little or no alpha emitters therein. Such assumption is a poor assumption, and is based on the mistaken belief that $^{210}$Pb is the primary alpha emitter in solders. Ideally there would be no alpha emitters present in a lead-free material, or at least the level of alpha emission would be below the very low threshold discussed above (i.e., having an alpha flux below about 0.002 cts/cm²/hr). Such is not available in lead-free solders conventionally utilized in semiconductor packaging, but can be achieved in lead-free solders prepared utilizing methodologies of the present invention. Specifically, methodologies of the present invention can substantially remove alpha emitters (such as isotopes of thorium and uranium) from lead-free solder materials. The removal of the alpha emitting contaminants can most easily be verified by measuring the alpha flux of the sample since they are normally present below the detection limits of most analytical methods such as glow discharge mass spectrometry (GDMS). However analytical methods like GDMS can be used to track the concentration of non alpha emitting impurities that are present in higher concentration than the alpha emitters and are removed at a similar rate as the alpha emitters during purification.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. A method of refining a lead-containing material, comprising:
   providing an initial composition of the lead-containing material, the initial composition having an alpha flux of greater than or equal to 0.002 cts/cm²/hr; and purifying the lead-containing material to form a second composition of the lead-containing material, the second composition having an alpha flux of less than 0.001 cts/cm$^2$/hr, wherein the purifying comprises electrorefining utilizing a bath comprising nitric acid and water, with the nitric acid being present at a concentration of from about 2% to about 50%, by volume.

2. The method of claim 1 wherein the purifying additionally comprises zone refining, chemical etching or a combination thereof.

3. The method of claim 1 wherein the purifying comprises electrorefining utilizing a bath consisting essentially of nitric acid and water, with the nitric acid being present at a concentration of from about 2% to about 50%, by volume.

4. The method of claim 1 wherein the lead-containing material of the second composition is at least 99.99% lead by weight.

5. The method of claim 1 wherein the second composition has an alpha flux of less than 0.0005 cts/cm$^2$/hr.

6. The method of claim 1 wherein the second composition has an alpha flux of less than 0.0002 cts/cm$^2$/hr.

7. The method of claim 1 wherein the second composition has an alpha flux of less than 0.0001 cts/cm$^2$/hr.

* * * * *